(12) United States Patent
Pance et al.

(10) Patent No.: US 8,690,410 B2
(45) Date of Patent: *Apr. 8, 2014

(54) DISPLAY ELEMENT INCLUDING MICROPERFORATIONS

(71) Applicant: Apple Inc., Cupertino, CA (US)

(72) Inventors: Aleksandar Pance, Saratoga, CA (US); Gregory L. Tice, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/670,061

(22) Filed: Nov. 6, 2012

(65) Prior Publication Data

US 2013/0063972 A1    Mar. 14, 2013

Related U.S. Application Data

(63) Continuation of application No. 12/778,785, filed on May 12, 2010, now Pat. No. 8,303,151.

(51) Int. Cl.
*F21V 7/04* (2006.01)

(52) U.S. Cl.
USPC ........... 362/606; 362/600; 362/602; 362/603; 362/604; 362/605; 362/60

(58) Field of Classification Search
None
See application file for complete search history.

(56) References Cited

U.S. PATENT DOCUMENTS

| | | | |
|---|---|---|---|
| 3,060,790 A | 10/1962 | Ward | |
| 3,754,209 A | 8/1973 | Molloy et al. | |
| 4,855,740 A | 8/1989 | Muramatsu et al. | |
| 5,040,479 A | 8/1991 | Thrash | |
| 5,317,105 A | 5/1994 | Weber | |
| 5,342,991 A | 8/1994 | Xu et al. | |
| 5,456,955 A | 10/1995 | Muggli | |
| 5,770,898 A | 6/1998 | Hannigan et al. | |
| 5,975,953 A | 11/1999 | Peterson | |
| 6,180,048 B1 | 1/2001 | Katori | |
| 6,347,882 B1 | 2/2002 | Vrudny et al. | |
| 6,545,668 B1 | 4/2003 | Hayama | |
| 6,654,174 B1 | 11/2003 | Huang | |
| 6,713,672 B1 | 3/2004 | Stickney | |

(Continued)

FOREIGN PATENT DOCUMENTS

| | | |
|---|---|---|
| CN | 201185147 | 1/2009 |
| EP | 1566686 | 8/2005 |

(Continued)

OTHER PUBLICATIONS

Author Unknown, "*Electronic Polymers, Semiconducting Polymers and Light Emitting Polymers—Focus of Polythiophene*," Azom.com, http://www.azom.com/details.asp?ArticleID=2772, at least as early as Dec. 1, 2005.

(Continued)

*Primary Examiner* — Natalie Walford
(74) *Attorney, Agent, or Firm* — Brownstein Hyatt Farber Schreck, LLP

(57) ABSTRACT

Methods and aparatuses disclosed herein relate to backlit visual display elements. A visual display element may include a base layer defining one or more microperforations and a light guide coupled to a light source. The light guide may be positioned adjacent the base layer and include one or more microlenses in alignment with the one or more microperforations along at least one vertical axis.

20 Claims, 5 Drawing Sheets

(56) References Cited

U.S. PATENT DOCUMENTS

| | | | |
|---|---|---|---|
| 6,724,370 B2 | 4/2004 | Dutta et al. | |
| 6,762,381 B2 | 7/2004 | Kunthady et al. | |
| 6,797,902 B2 | 9/2004 | Farage et al. | |
| 6,800,805 B2 | 10/2004 | Deguchi | |
| 6,834,294 B1 | 12/2004 | Katz | |
| 6,879,317 B2 | 4/2005 | Quinn et al. | |
| 6,998,594 B2 | 2/2006 | Gaines et al. | |
| 7,001,060 B1 | 2/2006 | Kimura | |
| 7,008,090 B2 | 3/2006 | Blank | |
| 7,019,242 B2 | 3/2006 | Kim | |
| 7,053,799 B2 | 5/2006 | Yu et al. | |
| 7,088,261 B2 | 8/2006 | Sharp et al. | |
| 7,109,465 B2 | 9/2006 | Kok et al. | |
| 7,133,030 B2 | 11/2006 | Bathiche | |
| 7,161,587 B2 | 1/2007 | Beck et al. | |
| 7,223,008 B2 * | 5/2007 | Henriet et al. | 362/617 |
| 7,236,154 B1 | 6/2007 | Kerr et al. | |
| 7,281,837 B2 | 10/2007 | Yue et al. | |
| 7,283,066 B2 | 10/2007 | Shipman | |
| 7,315,908 B2 | 1/2008 | Anderson | |
| 7,326,154 B2 | 2/2008 | Foley | |
| 7,364,339 B2 | 4/2008 | Park | |
| 7,414,213 B2 | 8/2008 | Hwang et al. | |
| 7,417,624 B2 | 8/2008 | Duff | |
| 7,446,303 B2 | 11/2008 | Maniam et al. | |
| 7,453,441 B1 | 11/2008 | Iorfida et al. | |
| 7,470,862 B2 | 12/2008 | Lin et al. | |
| 7,470,866 B2 | 12/2008 | Dietrich et al. | |
| 7,473,139 B2 | 1/2009 | Barringer et al. | |
| 7,501,960 B2 | 3/2009 | Price et al. | |
| 7,557,312 B2 | 7/2009 | Clark et al. | |
| 7,557,690 B2 | 7/2009 | McMahon | |
| 7,582,839 B2 | 9/2009 | Kyowski et al. | |
| 7,598,686 B2 | 10/2009 | Lys et al. | |
| 7,692,111 B1 | 4/2010 | Rosing et al. | |
| 7,710,369 B2 | 5/2010 | Dowling | |
| 7,712,910 B2 | 5/2010 | Ng et al. | |
| 7,750,282 B2 | 7/2010 | Mahowald et al. | |
| 7,750,352 B2 | 7/2010 | Thurk | |
| 7,769,353 B2 | 8/2010 | Dietrich et al. | |
| 7,778,015 B2 | 8/2010 | Weber et al. | |
| 7,778,590 B2 | 8/2010 | Kogo | |
| 7,825,907 B2 | 11/2010 | Choo et al. | |
| 7,825,917 B2 | 11/2010 | Bryant et al. | |
| 7,845,953 B2 | 12/2010 | Brock et al. | |
| 7,863,822 B2 | 1/2011 | Stoschek et al. | |
| 7,880,131 B2 | 2/2011 | Andre et al. | |
| 7,968,835 B2 | 6/2011 | Tsai | |
| 7,977,593 B2 | 7/2011 | Kyowski et al. | |
| 8,017,216 B2 | 9/2011 | Kato et al. | |
| 8,018,170 B2 | 9/2011 | Chen et al. | |
| 8,080,753 B2 | 12/2011 | Yeh et al. | |
| 8,110,744 B2 | 2/2012 | Wong et al. | |
| 8,160,562 B2 | 4/2012 | Yuki et al. | |
| 8,217,887 B2 | 7/2012 | Sangam et al. | |
| 8,232,958 B2 | 7/2012 | Tolbert | |
| 8,282,261 B2 | 10/2012 | Pance et al. | |
| 8,303,151 B2 | 11/2012 | Pance et al. | |
| 8,358,274 B2 | 1/2013 | Hsieh | |
| 8,378,857 B2 | 2/2013 | Pance et al. | |
| 8,378,972 B2 | 2/2013 | Pance et al. | |
| 8,451,146 B2 | 5/2013 | Mahowald et al. | |
| 2001/0053082 A1 | 12/2001 | Chipalkatti et al. | |
| 2003/0174072 A1 | 9/2003 | Salomon | |
| 2003/0210221 A1 | 11/2003 | Aleksic | |
| 2004/0032745 A1 | 2/2004 | Pederson | |
| 2004/0230912 A1 | 11/2004 | Clow et al. | |
| 2004/0238195 A1 | 12/2004 | Thompson | |
| 2005/0073446 A1 | 4/2005 | Lazaridis et al. | |
| 2006/0022951 A1 | 2/2006 | Hull | |
| 2006/0158353 A1 | 7/2006 | Tseng | |
| 2006/0227085 A1 | 10/2006 | Boldt et al. | |
| 2007/0046646 A1 | 3/2007 | Kwon et al. | |
| 2008/0001787 A1 | 1/2008 | Smith et al. | |
| 2008/0024470 A1 * | 1/2008 | Andre et al. | 345/204 |
| 2008/0127537 A1 | 6/2008 | Boisseau | |
| 2008/0143560 A1 | 6/2008 | Shipman | |
| 2008/0166006 A1 | 7/2008 | Hankey et al. | |
| 2008/0303918 A1 | 12/2008 | Keithley | |
| 2009/0201179 A1 | 8/2009 | Shipman et al. | |
| 2010/0008030 A1 * | 1/2010 | Weber et al. | 361/679.02 |
| 2010/0265181 A1 | 10/2010 | Shore | |
| 2010/0300856 A1 | 12/2010 | Pance et al. | |
| 2010/0301755 A1 | 12/2010 | Pance et al. | |
| 2010/0302169 A1 | 12/2010 | Pance et al. | |
| 2010/0306683 A1 | 12/2010 | Pance et al. | |
| 2011/0280042 A1 | 11/2011 | Pance et al. | |
| 2011/0304485 A1 | 12/2011 | Mahowald et al. | |
| 2012/0012448 A1 | 1/2012 | Pance et al. | |
| 2012/0013490 A1 | 1/2012 | Pance | |
| 2013/0093330 A1 | 4/2013 | Pance et al. | |
| 2013/0163223 A1 | 6/2013 | Pance | |
| 2013/0256108 A1 | 10/2013 | Mahowald et al. | |

FOREIGN PATENT DOCUMENTS

| | | |
|---|---|---|
| EP | 1881513 | 1/2008 |
| EP | 2017694 | 1/2009 |
| GB | 2431001 | 4/2007 |
| JP | 60004094 | 1/1985 |
| KR | 100870113 | 11/2008 |
| WO | WO2007/002796 | 1/2007 |
| WO | WO2007/102633 | 9/2007 |
| WO | WO2009/136929 | 11/2009 |

OTHER PUBLICATIONS

Author Unknown, "*Long Polymers Light Up LEDs*," Physicsweb.org, http://www.physicsweb.org/articles/news/6/4/22/1, at least as early as Apr. 30, 2002.

Author Unknown, "*Optimus Keyboard*," Art.Lebedev Studio, http://www.artlebedev.com/portfolio/optimus/, at least as early as Dec. 1, 2005.

Author Unknown, "*Optimus OLED Keyboard*," Gizmodo: The Gadgets Weblog, http://www.gizmodo.com/gadgets/peripherals/input/optimus-oled-keyboard-112517.php, at least as early as Dec. 1, 2005.

Author Unknown, "*Optimus OLED Keyboard with Customizable Layout*," Gear Live, http://www.gearlive.com/index.php/news.article/optimus_oled_keyboard_07131058/, at least as early as Dec. 1, 2005.

Author Unknown, "*Optimus Russian Keyboard*," Primo Tech, http://www.primotechnology.com/index.php?art+articles/0705/optimus/index.htm, at least as early as Dec. 1, 2005.

Author Unknown, "Organic Light-Emitting Diode," Wikipedia.com, http://en.wikipedia.org/wiki/OLED, at least as early as Dec. 1, 2005.

Author Unknown, "*Organic Polymers to Precede Nano Semi*," EETimes.com, http://www.eet.com/story/OEG20030923S0055, at least as early as Dec. 1, 2005.

Author Unknown, "How, Why & Where to Use Self-Clinching Fasteners," PennEngineering, http://www.pemnet.com/fastening_products/about_self_clinching/index.html, 2 pages, at least as early as Dec. 21, 2011.

Author Unknown, "*Physics News Update*," American Institute of Physics, http://www.aip.org/pnu/1993/split/pnu1148-3.htm, Oct. 19, 1993.

Author Unknown, "*Polymer Light-Emitting Diodes*," Philips Research—Technologies, http://www.research.philips.com/technologies/display/polyled/polyled/, at least as early as Dec. 1, 2005.

Author Unknown, "*What is OLED (Organic Light Emitting Diode)?*," WiseGeek.com, http://www.wisegeek.com/what-is-an-oled.htm?referrer+adwords_campaign=oled_ad=024 . . . , at least as early as Dec. 1, 2005.

Author Unknown, "*What is PLED?—A Word Definition from the Webopedia Computer Dictionary*," http://www.webopedia.com/TERM/P/PLED/html, at least as early as Dec. 1, 2005.

(56) References Cited

OTHER PUBLICATIONS

Braun et al., "*Transient Repsonse of Passive Matrix Polymer LED Displays*," http://www.ee.calpoly.edu/~dbraun/papers/ICSM2000BraunEricksonK177.html, at least as early as Dec. 1, 2005.

Rojas, "*Optimus Keyboard Trumped by the Display Keyboard?*," http://www.engadget.com/2005/07/29/optimus-keyboard-trumped-by-the-display-keyboard/, Jul. 29, 2005.

U.S. Appl. No. 13/770,799, filed Feb. 19, 2013, Pending.

U.S. Appl. No. 13/903,466, filed May 28, 2013, Pending.

* cited by examiner

DISPLAY ELEMENT INCLUDING MICROPERFORATIONS

CROSS-REFERENCE TO RELATED APPLICATION

This application is a continuation of U.S. patent application Ser. No. 12/778,785, entitled "Microperforation illumination", filed on May 12, 2010, now U.S. Pat. No. 8,303,151, which claims priority to and is incorporated by reference as if fully set forth herein.

BACKGROUND OF THE INVENTION

Background

I. Technical Field

The present invention relates generally to visual displays, and more particularly to backlit visual display elements.

II. Background Discussion

Electronic devices are ubiquitous in society and can be found in everything from household appliances to computers. Many electronic devices include visual display elements that can be used for various purposes, such as visual indicators for indicating the status of a device, in conjunction with a user input device, and so on and so forth. In some cases, input devices (such as keyboards, mice and the like) may be selectively or fully backlit and thus also function as a display element. Other visual display elements may have a purely aesthetic function.

While providing attractive visual display elements and indicators for a user is very important in many electronic devices, much of the aesthetic appeal of a device can quickly be compromised if the visual display elements do not transmit enough light to be adequately perceived by a user. The aesthetic appeal of a device may also be diminished if inactive visual display elements remain perceptible to the user when in an "off" state. Additionally, the light source required for many visual display elements can quickly drain the power source of the electronic device, which may be a problem, for example, when the electronic device is running on battery power or some other depletable power source. Likewise, uneven or inadequate lighting may make a display element difficult to read.

While many designs for providing displays, lights and other visual indicators on electronic and personal devices have generally worked well in the past, there is always a desire to provide new and improved designs or techniques that result in even more aesthetically pleasing and power-efficient visual display elements. In particular, the ability to provide visual display elements on electronic and personal devices in a manner that can generate a sufficient amount of light to fulfill a purpose, while conserving space and power is desirable.

SUMMARY

Methods and aparatuses disclosed herein relate to backlit visual display elements. Backlit visual display elements may be provided in the housing of an electronic device. More particularly, the backlit visual display elements disclosed herein include a microperforated base layer, as well as a light guide that is positioned adjacent the microperforated base layer. The display elements may further include a light source that is coupled to one side of the light guide. In some embodiments, an input device may be coupled to the light source. The input device may be semi- or completely transparent, and may, in some embodiments, be positioned between the light guide and the base layer.

Some embodiments may take the form of a visual display element including a base layer defining one or more microperforations and a light guide coupled to a light source. The light guide may be positioned adjacent the base layer and include one or more concave microlenses that are aligned with the one or more microperforations along at least one vertical axis.

Other embodiments may take the form of another visual display element. The visual display element may include a base layer defining a first microperforation. The first microperforation includes a first microperforation wall defining a first gradient. The visual display element may further include a light guide coupled to a light source. The light guide may include a first microlens. The first microlens may include a first lens wall defining a second gradient. The first gradient may be substantially equal to the second gradient.

Still other embodiments may take the form of a method for manufacturing a visual display element. The method may include forming one or more microperforations on a surface of a base layer. The method may also include providing a light guide configured to transmit light from a light source and including one or more microlenses. Additionally, the method may include aligning the one or more microlenses with the one or more microperforations so that light transmitted by the light guide is directed through the one or more microperforations.

BRIEF DESCRIPTION OF THE DRAWINGS

The use of the same reference numerals in different drawings indicates similar or identical items.

DETAILED DESCRIPTION OF THE INVENTION

Embodiments described herein relate to aesthetically visual display elements that can be backlit. In particular, such visual displays can include a microperforated and backlit display. Such displays can be used on an electronic device, such as, for example, a personal computer, such as a laptop computer or a desktop computer, television, a media player, a cellular telephone, personal digital assistant (PDA), and so on and so forth. Furthermore, some embodiments can also be used for visual displays on other items that may not be electronic devices, as will be readily appreciated, and all such other uses are specifically contemplated.

The term "horizontal" as used herein is defined as a plane parallel to the plane or surface of the base layer defining the visual display elements, regardless of its orientation. The term "vertical" refers to a direction perpendicular to the horizontal direction just defined. Terms such as "above," "below," "bottom," "top," "side" (e.g., as in "sidewall"), "higher," "lower," "upper," "over," and "under" are defined with respect to the horizontal plane.

In various embodiments, a microperforated and backlit display is provided. Miniature holes or "microperforations" formed in a base object for such a display are preferably tiny enough so that they cannot be readily distinguished at the base material surface by the naked human eye, but are large enough so that light can pass therethrough and be seen by the naked human eye. In general, such microperforations should extend from one side of the base material to another side, such that light can be passed therethrough. In some embodiments, the microperforations may be filled with a transparent material, such as glass, plastic, and/or some other material, so as to allow light to pass through the microperforations while preventing corrosion and contamination of the microperforation passage, e.g., with dirt, oil, etc.

In some embodiments, the base layer may be a portion of the housing of an electronic device. For example, in the embodiment shown in FIGS. 1A-1C, the base layer may be the top or outermost surface of the cover of a laptop computer. Although one or more of the embodiments disclosed herein may be described in detail with reference to a particular electronic device, the disclosed embodiments should not be interpreted or otherwise used as limiting the scope of the disclosure, including the claims. In addition, one skilled in the art will understand that the following description has broad application. Accordingly, the discussion of any embodiment is meant only to be exemplary and is not intended to suggest that the scope of the disclosure, including the claims, is limited to these embodiments.

Figure 1A:
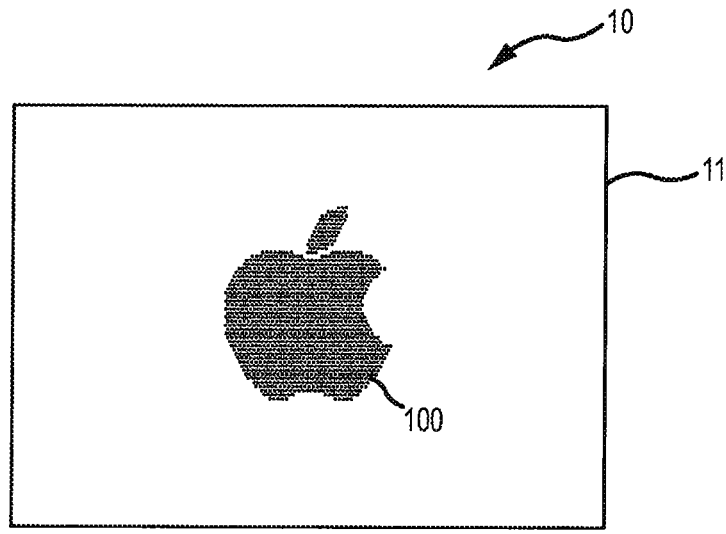
FIG. 1A illustrates a top plan view of a laptop computer in a closed position and having a visual display element on its cover.

FIG. 1A shows, in top plan view, an example laptop computer 10 in a closed position and having a design on its cover 11. As shown, the top cover 11 includes a visual display element 100 in the shape of a sample design. The visual display element 100 can be, for example, a backlit microperforated pattern and may also have a different surface finish than the rest of top cover 11, as described in greater detail below. In other embodiments, the visual display element may be provided on different electronic devices. The visual display element may be any design, including a wide variety of shapes, sizes and types, and is not limited to the design shown in FIGS. 1A-1D.

Figure 1B:
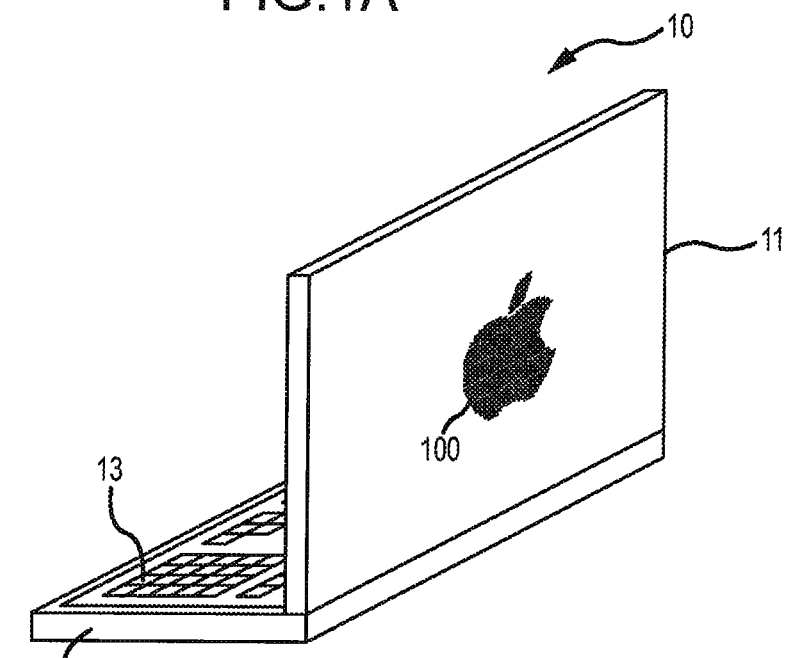
FIG. 1B illustrates a side perspective view of the laptop of FIG. 1A in an open position.

FIG. 1B illustrates the same sample laptop computer 10 as depicted in FIG. 1A, only in an open position and in side perspective view. Laptop computer 10 can also include a lower portion 12 that may include a keyboard 13. Again, top cover 11 can include a visual display element 100.

The visual display element 100 can include a pattern of numerous microperforations formed in the material of the top cover 11. The microperforated pattern can be formed on virtually any opaque base layer where a visual display element is desired, including, but not limited to, the laptop computer cover 11 shown in FIGS. 1A-1C. In one embodiment, the base material forming the base layer may be a metallic material, such as, for example, stainless steel, aluminum, titanium, copper, magnesium and the like. However, any base material that is readily amenable to the formation of such microperforations can be used.

Figure 1C:
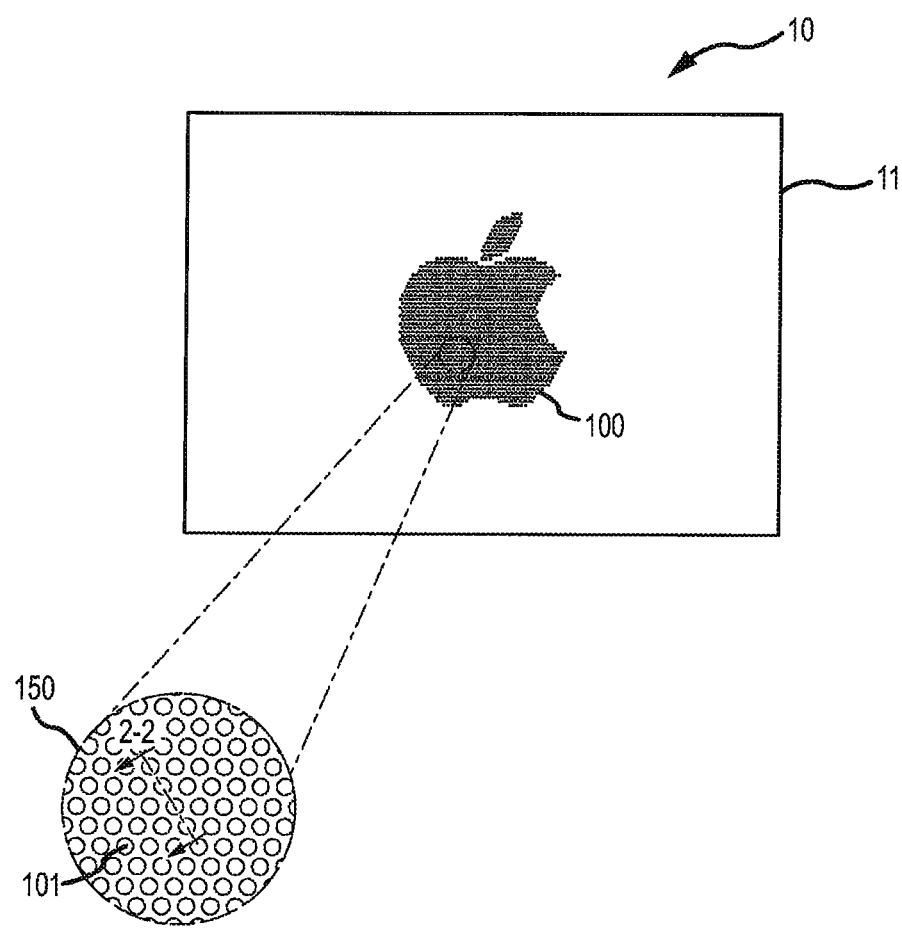
FIG. 1C illustrates a closeup and partially cutaway view of the visual display element on the laptop of FIG. 1A.

Continuing to FIG. 1C, the visual display element 100 of FIGS. 1A and 1B is shown in closeup and partially cutaway view, in order to accentuate the existence of the microperforations. The closeup portion 150 of top cover 11 is the view that actually depicts the various microperforations 101 forming the visual display element 100. As shown, the visual display element 100 is formed in the shape of a design. This design is formed from a collection of multiple microperforations, which can range from a few to dozens, hundreds or even thousands. Such a microperforation field or pattern can be made visible on one side by providing a light source on another side.

Figure 2:
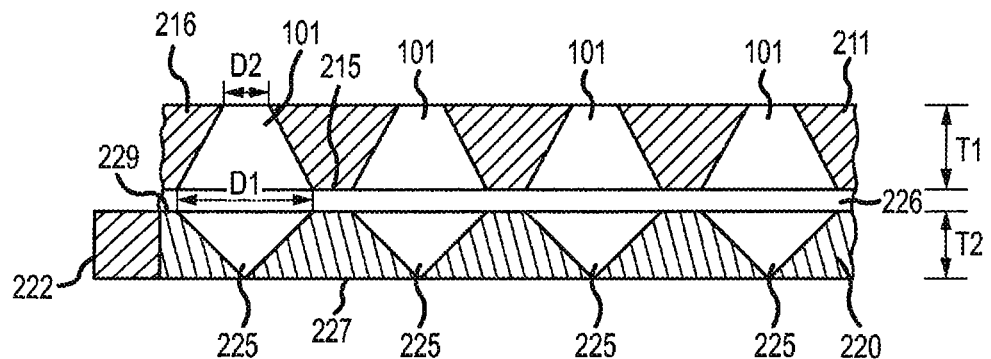
FIG. 2 illustrates a closeup and partially cutaway side cross-sectional view of the visual display element of FIG. 1A, as taken along line 2-2 of FIG. 1C.

FIG. 2 illustrates a partial cross-sectional view of an example of a base layer having a microperforated and backlit visual display element, as taken along line 2-2 of FIG. 1C. As shown in FIG. 2, the base layer includes multiple microperforations 101 that extend from a bottom surface 215 to a top surface 216 of the base layer 211, which may be e.g., the housing of an electronic device, such as the laptop cover 11 shown in FIGS. 1A-1C. A light guide 220 configured to transmit light from a light source 222 may be provided below the base layer 211 and encased in the housing. In other embodiments, the light guide and/or source may not be completely encased in the housing. Thus, light may be emitted in an X or Y direction into the light guide by a light source. As the light impacts the microlenses, it is focused by the lens into a collimated (or partially collimated) beam and redirected into the Z-direction. In this manner, light may be focused and transmitted into the microperforations. In one embodiment, the light source 222 may be adjacent a portion of the base layer 211. The light guide 220 may be coupled to a wide variety of light sources 222, including, but not limited to, a light emitting diode, a liquid crystal element, an electroluminescent light, or any other suitable light source for such a purpose.

As will be further discussed below, the light guide 200 may be a light guide panel (LGP) that has a plane surface 230 and one or more concave microlenses 225 to refract and/or reflect light. In one embodiment, the pattern of microlenses 225 defined in the light guide panel may be vertically aligned with and match the pattern of microperforations 101 defined in the base layer 211 when the electronic device is assembled. Accordingly, in one embodiment of a fully assembled electronic device, each microlens 225 may be vertically aligned with a microperforation 101 positioned directly underneath it.

An adhesive 226 may be used to affix the light guide 220 to the bottom surface 215 of the base layer. For example, the adhesive may be an optically clear double-sided adhesive 230, such that light can be passed through the adhesive. Other adhesives, such as a fluid adhesive, may also be used in conjunction with the described embodiments.

Various thicknesses for the base layer 211 can be used. In one embodiment, for example, the thickness T1 of the base layer may be about 250-400 microns. Alternative applications may lend themselves to different thicknesses depending upon circumstances, as will be readily appreciated. For example, a smaller thickness might be preferable for a smaller item, such as for a handheld or other device, or to reduce the weight of a device.

The microperforations 101 may have a tapered configuration so that each microperforation gradually narrows toward one end. For example, as shown in FIG. 2, the microperforations may taper toward the top surface 216 of the base layer 211. In one embodiment, the microperforations 101 may have a truncated cone configuration so that the top ends of the microperforations, i.e., that face the user, have smaller diameters D2 than the diameters D1 of the bottom ends of the microperforations.

The diameters D2 of the tops of the microperforations may be small enough so as to be imperceptible or difficult to resolve using the naked human eye when the microperforations are in an off or unilluminated state. For example, the top ends of the microperforations may be about 100 microns or less in diameter, and may be even smaller, for example, about 30 microns or less. In some embodiments, the diameters of the top ends of the microperforations can range from about 20 microns to about 50 microns in diameter. In contrast, the diameters D1 of the bottom ends of the microperforations may be larger than the top ends of the microperforations D2, at about 200 microns or less in diameter, or may be even smaller, at about 120 microns or less in diameter. The measurements discussed above are only sample measurements, and in other embodiments, either end of the microperforations may be larger or smaller.

Other larger or smaller microperforation diameters can also be used, as may be desired for a particular visual display implementation. For example, a microperforation having a larger top diameter may allow for the emission of more light from the light guide, but may be more visible to the naked eye even when a corresponding light source is in an off or unilluminated state. Conversely, a smaller top diameter may hinder the emission of light from the light guide, but may be less perceptible when the backlight is in an off or unilluminated state. In another embodiment, the diameters of the top ends of the microperforations may be larger than the diameters of the bottom ends of the microperforations so that the microperforations taper toward the bottom surface 215 of the base layer 211. In a further embodiment, the microperforations may have a substantially uniform diameter throughout so that the microperforations are essentially cylindrical. Additionally, in another embodiment, the microperforations may extend at an angle so that the top ends of the microperforations may be vertically or horizontally offset from the bottom ends of the microperforations.

The gradient of the sidewalls of the microperforations can also be varied to create different visual effects. For example, a larger difference between the diameters D1 of the bottom ends of the microperforations and the diameters D2 of the top ends of the microperforations may result in a lower sidewall gradient, while a smaller difference between the diameters D1 of the bottom ends of the microperforations and the diameters D2 of the top ends of the microperforations may result in a steeper sidewall gradient. This may also impact the amount of light that is transmitted through the microperforations. For example, a steeper sidewall gradient may result in the emission of a higher intensity beam of light, while a smaller gradient may result in a less focused beam of light and/or less light exiting the microperforation.

The microperforations may formed by a variety of suitable techniques. In one embodiment, the microperforations may be cut by lasers. For example, the microperforations may be formed by projecting a laser beam on the bottom surface 215 of the base layer 211 and rotating the beam in a spiral pattern to create the conical configuration of the microperforations. In particular, the laser beam may be initially orbited in a circular path having a wider diameter D1 to define the edges of the bottoms of the microperforations, and then at progressively reduced diameters to reduce the diameters of the microperforations toward the top surface 216 of the base layer 211. The orbit is thus progressively and continuously reduced until it is the diameter D2 of the bottoms of the microperforations at the conclusion of the hole formation. The laser may be provided by a computer numerical controlled laser tool, and may have any suitable wavelength for cutting through the base layer 211. For example, the laser may be an ultra-violet laser, a green laser, or a YAG laser, depending on the desired size and shape of the microperforation. The laser spiral cutting technique described above is only one technique for forming the microperforations. Accordingly, other methods for forming the microperforations may entail the use of other techniques and/or machinery, as is known.

The light guide can be formed from any suitable material for transmitting and diffusing light through the light guide, including plastic, acrylic, silica, glass, and so on and so forth. Additionally, the light guide may include combinations of reflective material, highly transparent material, light absorbing material, opaque material, photosensitive film, light dispersing material, metallic material, optic material, polarizing material, and/or any other functional material to provide extra modification of optical performance. In addition, the light guide may take the form of a film, panel, plate, or any other suitable structure with an appropriate thickness. Various thicknesses for the light guide can be used. For example, the thickness T2 of the light guide may be about 300-400 microns. Alternative applications may lend themselves to different thicknesses depending upon circumstances, as will be readily appreciated.

The light guide may include an array of concave microlenses 225. As shown in FIG. 2, the microlenses 225 may each have a tapered configuration. In one embodiment, the microlenses may have a substantially conical configuration, in which the bottom end of each microlens is pointed. In other embodiments, the microlenses may define truncated cones, in which the bottoms of the microlenses form a substantially flat surface. Additionally, in some embodiments, the microlenses may include a curved concave surface. The microlenses may or may not define a hole that penetrates through the light guide. In some embodiments, the microlenses may be thickened, denser, or a shaped section of the same material of the light guide. Accordingly, the microlenses may be made of the light guide material, rather than representing a hole in or lack of material.

As is known, the microlenses 225 may be formed using a variety of techniques, including laser-cutting techniques, and/or micro-machining techniques, such as diamond turning. After the microlenses 225 are formed, an electrochemical finishing technique may be used to coat and/or finish the microlenses to increase their longevity and/or enhance or add any desired optical properties. Other methods for forming the microlenses may entail the use of other techniques and/or machinery, as is known.

In one embodiment, the diameters D3 of the microlenses may be the substantially equal to the diameters D1 of the bottoms of the microperforations 101. Accordingly, the diameters D3 of the microlenses 225 may be 100 microns or less in diameter, and may be even smaller, for example, about 30 microns or less. In some embodiments, the diameters of the tops of the microlenses can range from about 20 microns to about 50 microns in diameter. Other larger or smaller microperforation diameters can also be used, as may be desired for a particular visual display implementation. For example, the diameters D3 of the microlenses 225 may be larger or smaller than the diameters D1 of the bottom ends of the microperforations 101.

Referring to the embodiment shown in FIG. 2, light from the side-coupled light guide may be both refracted in different directions and transmitted along the horizontal plane for backlighting other microperforations. The gradients of the microlens 225 sidewalls may be adjusted in different embodiments to increase or decrease the amount of light transmitted in a vertical direction, and the corresponding brightness of the microperforations 101. Accordingly, the intensity of light emitted by the microperforations 101 may be increased by selecting a sidewall gradient that enhances the amount of light refracted in a vertical direction and through the tops of the microperforations 101. Alternatively, the intensity of light emitted by the microperforations 101 may be decreased by selecting a sidewall gradient that reduces the amount of light refracted in a vertical direction.

The use of microlenses 225 on the light guide 220 may afford many benefits to an associated electronic device. For example, the microlenses 225 may impart a power savings. More particularly, the microlenses 225 may allow for the use of a lower-power light source (or operating a light source at a lower power) by more efficiently transmitting light from the light source 222 through the microperforations 101. Additionally, the microlenses 225 may also conserve space within the electronic device, allowing for a more compact design. For example, because the microlenses 225 reduce the amount of light lost over the length of the light guide due to scattering and/or diffraction, the light source 222 may be side-coupled to the light guide 220, rather than bottom or top-coupled, and output similar light through the microperforations. Accordingly, the thickness of the base layer, as coupled to the light guide, may be under 1 millimeter.

In one embodiment, the gradient of the microlenses may have a cross-sectional profile that is similar or identical to the cross-sectional profile of the microperforations. More particularly, the gradient of the microlens sidewalls may be substantially equal to the gradient of the microperforation sidewalls and the diameters D3 of the tops of the microlenses may be the substantially equal to the diameters D1 of the bottoms of the microperforations 101. For example, the angle defined by the microlens sidewalls may be within ±5 degrees of the angle defined by the microperforation sidewalls. Such a configuration may allow for maximum reflection of light by the microlens through the microperforations, since at least a portion of the scattered light, if any, may be captured by the microlens and microperforation walls and transmitted through the microperforations. Other embodiments may vary the cross-sectional profiles of the microperforations and microlenses.

As shown in FIG. 2, the array of microlenses 225 may be vertically aligned with the microperforations 101 about a vertical axis. For example, in one embodiment, the microlenses 225 and the microperforations 101 may be concentric. Alignment of the microlenses 225 with the microperforations 101 may further facilitate efficient transmission of light from the light source 222 through the top ends of the microperforations 101 by enhancing the amount of light transmitted through the microperforations 101 and reducing light scattering and diffraction.

Although the disclosed embodiments utilize concave or conic types of microlenses, convex microlenses can also be utilized. Additionally, in other embodiments, the bottom surface of the light guide may also include convex and/or concave lenses, as appropriate to create a desired optical effect.

As alluded to above, the parameters of the microlenses and the microperforations may be varied to create different visual effects. In one embodiment, the parameters of the microlenses and microperforations may be varied so as to enhance light transmitted by microperforations that are further from a light source and increase the uniformity of light emitted by a visual display element. One implementation of this embodiment is shown in FIG. 3, illustrating a partial cross-sectional view of another example of a visual display element in which the sizes of the microperforations 301 and the microlenses 325 are increased with respect to distance from the light source 222.

Figure 3:
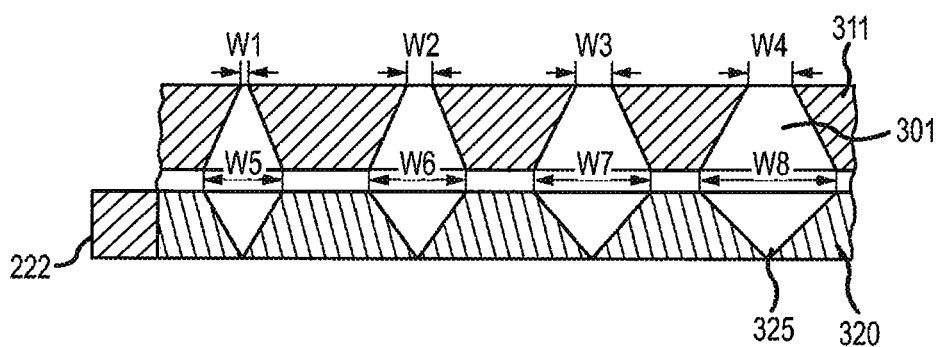
FIG. 3 illustrates a closeup and partially cutaway side cross-sectional view of a second embodiment of a visual display element, as taken along a line similar to line 2-2 of FIG. 1C.

Referring to FIG. 3, the top and bottom diameters W1-W8 of the microperforations 301 may be gradually enlarged with respect to their distance from the light source 222 to counterbalance losses in light as it is transmitted along the light guide 320. Accordingly, microperforations 301 that are further away from a light source 222 may be configured to emit substantially the same amount of light as microperforations 301 that are closer to the light source 222. As shown in FIG. 3, the diameters W5-W8 of microlenses 325 that are further from the light source 222 may be similarly enlarged to capture more light from the light source 222. Increasing the amount of light emitted by the microperforations 301 that are further from the light source 222 may increase the uniformity of light across a particular display element, while also reducing the number of light sources needed to compensate for losses in light intensity along the length of the light guide.

In other embodiments, only the top and/or the bottom diameters of the microperforations may be gradually enlarged with respect to their distance from the light source 222, and the diameters of the microlenses may be uniform. Alternatively, the diameters of the microlenses 325 may be increased, and the top and/or bottom diameters of the microperforations may be uniform. In other embodiments, the sidewall gradients of the microperforations 301 and/or the microlenses 325 may be adjusted to further maximize light transmitted by microperforations that are further from a light source.

Similarly, in other embodiments, the diameters of the microperforations and/or the microlenses may be increased or decreased to create other visual effects. For example, the diameters of some of the microperforations and/or microlenses may be increased or decreased so that the visual element, when lit, may include brighter and/or dimmer portions.

Figure 4:
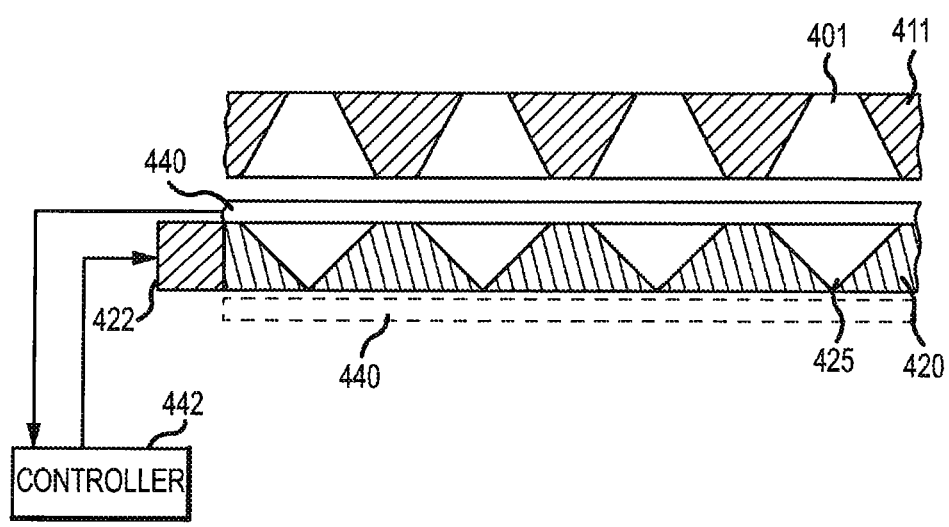
FIG. 4 illustrates a closeup and partially cutaway side cross-sectional view of a third embodiment of a visual display element, as taken along a line similar to line 2-2 of FIG. 1C.

FIG. 4 illustrates a partial cross-sectional view of another embodiment of a base layer having a microperforated and backlit visual display element including an input-output interface. The embodiment may include a base layer 411 defining multiple microperforations 401, as well as a light guide 420 defining one or more microlenses 425. The light guide 420 may be side-coupled to a light source 422. The base layer 411, microperforations 401, light guide 420, light source 422, and microlenses 425 may be similar to those described above with respect to the embodiments shown in FIGS. 1A-3.

As shown in FIG. 4, the embodiment may further include one or more input elements 440, such as keyboards, mice, touchpads, and so on and so forth, disposed within the electronic device. In the illustrated embodiment, the one or more input elements 440 may be disposed between the base layer 411 and the light guide 420. However, in other embodiments, the one or more input elements may be disposed underneath the light guide 420 (as shown in phantom in FIG. 4), on the exterior of the electronic device, and so on and so forth. The base layer, light guide 420, and/or input elements 440 may be joined using an adhesive (not shown).

The housing input element 440 may be widely varied. For example, in the embodiment shown in FIG. 4, the housing input element 440 may be a capacitive sensing element for detecting proximity, position, and so on, based on capacitive coupling effects. In other embodiments, the housing input element 440 may correspond to touch sensors, pressure sensors, proximity sensors, etc. The housing input element 440 may operate alone or in conjunction with other sensors and/or input devices to extract information from the surroundings of the electronic device or a user input device. The housing input element 440 may be configured to interact at the exterior portion or outside the outer periphery of the base layer 411 and generate electrical signals correlative with the interactions.

The electrical signals generated by the housing input element 440 typically are provided to a controller 442 that is configured to interpret the electrical signals as input to the electronic device. The controller 442 may generate an output signal in response to the input. The output signal may be provided to the light source 425, which functions as an output element. For example, the light source 425 may be configured to transmit light according to an electrical signal received by the controller 442 via the housing input element 440.

As discussed above, the housing input element 440 may be a capacitive sensing layer including one or more capacitive sensors. As is known, the sensors can be constructed from many different materials, such as indium tin oxide (ITO), copper, printed ink, etc. In one embodiment, the housing input element 440 may be a semi- or completely transparent capacitive sensing layer including transparent ITO so that light from the light guide 425 may be visible through the housing input element 440.

Since the housing input element 440 is provided underneath the base layer 411, the input element may not affect the exterior portion of the base layer 411, thereby keeping the input element substantially hidden. Thus, the housing input element 440 may define an active area that may be over an extended surface of the base layer 411, i.e., the entire bottom surface, the entire surface of an enclosure and/or select areas, i.e., specific locations about the surface of the housing. Furthermore, the active area may be localized or short range (e.g., touch or near touch), extended, or long range (e.g., substantially away from the surface). Specifically, the housing input element 440 may be configured to receive external data via the base layer 411.

The housing input element 440 may be implemented in a variety of electronic devices including, but not limited to, portable computing devices, cell phones, televisions, personal computers, smart phones, personal digital assistants, media players, appliances such as refrigerators, microwave ovens, etc. and any other suitable electronic device. In one embodiment, a trackpad may be microperforated and backlit. As such, although the description included herein may include some specific embodiments and may be related to particular functions, it should be understood that the housing I/O interface may be implemented in a wide variety of device and may perform a variety of functions beyond the embodiments specifically described herein.

Figure 5:
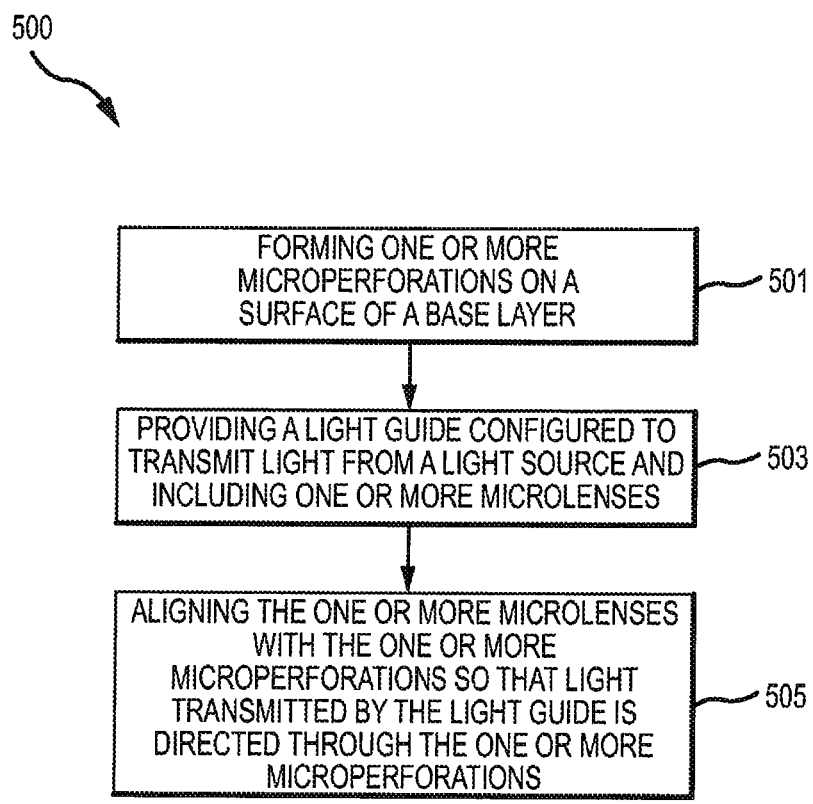
FIG. 5 is a flow chart illustrating operations of a method for manufacturing a visual display element.

FIG. 5 shows a flow chart illustrating operations 500 of a method for manufacturing a visual display element. In operation 501, the method may include forming one or more microperforations on a surface of a base layer. As discussed above, the base layer may be the housing of an electronic device. The microperforations may be tapered toward the top surface of the base layer. In operation 503, the method may include providing a light guide configured to transmit light from a light source and including one or more microlenses. In one embodiment, the light guide may be a light guide panel. The microlenses may have the same diameters as the bottom ends of the microperforations.

In operation 505, the method may include aligning the one or more microlenses with the one or more microperforations so that light transmitted by the light guide is directed through the one or more microperforations. As discussed above, the microlenses may be configured to transmit light in a vertical direction to maximize the amount of light transmitted through the microperforations. This may be accomplished by adjusting the gradient of the microlens sidewalls to refract light in a vertical direction. In other embodiments, the diameters of the tops and/or bottoms of the microperforations may be increased to allow more light to be transmitted through the microperforations. Similarly, the diameters of the microlenses may be increased to transmit more light from the light source in a vertical direction.

Other embodiments may include the use of an input device, such as a capacitive sensor. The capacitive sensor may be positioned between the base layer and the light guide, and may be semi- or completely transparent so that light can be transmitted through the capacitive sensor.

Some embodiments may use side-firing light sources, such as side-firing LEDs. In one example, two side-firing light sources may be positioned on opposite sides of a light guide. Other embodiments may utilize different colored light sources. For example, one embodiment may use multiple light sources of different colors to convey status and/or input device information.

Additionally, in other embodiments, an ambient light sensor may be connected to the light source, and the pulse-width modulation of the light source may be varied based on the amount of ambient light detected by the light sensor. This may provide additional power savings to the electronic device.

In a further embodiment, the light guide may include angled microlenses to direct light in different directions. For example, the top end of the microperforation may be offset from the bottom end of the microperforation to focus the light in an angled beam. This may enhance the uniformity of light distribution from the microperforated design, and reduce light discrepancies and/or uneven light distribution due structural elements, distance from the light guide, and so on and so forth.

What is claimed is:

1. A visual display element, comprising:
a base layer defining one or more microperforations; and
a light guide coupled to a light source, the light guide positioned adjacent the base layer and adapted to couple light from the light source into the one or more microperforations along at least one vertical axis.

2. The visual display element of claim 1, wherein the light guide comprises:
a first surface facing the base layer;
a second surface opposite the first surface; and
a third surface extending between the first surface and the second surface, wherein:
the light source is coupled to the third surface of the light guide.

3. The visual display element of claim 1, wherein the base layer comprises:
a first surface facing the light guide; and
a second surface opposite the first surface; wherein
the one or more microperforations taper in cross-section toward the second surface.

4. The visual display element of claim 1, wherein the light guide includes one or more convex microlenses configured to transmit light in a direction substantially perpendicular to the base layer.

5. The visual display element of claim 1, wherein the light guide comprises a first surface facing the base layer; and a second surface opposite the first surface; wherein the one or more microlenses have a conical configuration and taper toward the second surface of the light guide.

6. The visual display element of claim 1, wherein: a first end of the one or more microperforations has a first diameter; a second end of the one or more microperforations has a second diameter larger than the first diameter; and the second diameter of the one or more microperforations is substantially equal to a diameter of the one or more microlenses.

7. The visual display element of claim 1, wherein:
the one or more microperforations comprise a first microperforation having a first end defining a first diameter and a second end defining a second diameter larger than the first diameter; and
the one or more microperforations further comprise a second microperforation having a third end having a third diameter and a fourth end defining a fourth diameter larger than the third diameter;
the second microperforation is further from the light source than the first microperforation, and
the third diameter of the second microperforation is larger than the first diameter of the first microperforation.

8. The visual display element of claim 1, further comprising an input device coupled to the light source.

9. The visual display element of claim 8, wherein the input device is positioned between the base layer and the light guide.

10. The visual display element of claim 9, wherein the input device is a capacitive sensor comprising indium tin oxide.

11. A visual display element, comprising:
a base layer defining a microperforation, the microperforation including a microperforation wall defining a microperforation gradient; and
a light guide coupled to a light source, the light guide including a convex microlens, the convex microlens configured to couple light from the light source into the microperforation.

12. The visual display element of claim 1, wherein the first microlens is configured to transmit light in a direction substantially perpendicular to the base layer.

13. The visual display element of claim 1, wherein the first microperforation takes the shape of a truncated cone.

14. The visual display element of claim 11, wherein: the light guide further includes a concave microlens including a first lens wall defining a lens gradient; and
the microperforation gradient is substantially equal to the lens gradient.

15. The visual display element of claim 11, wherein the microperforation has a first end having a first diameter and a second end opposite the first end and having a second diameter larger than the first diameter, the convex microlens has a third diameter, and the second diameter of the microperforation is substantially equal to the third diameter of the convex microlens.

16. The visual display element of claim 15, wherein the first microlens is substantially aligned with the second end of the first microperforation along at least one vertical axis.

17. The visual display element of claim 4, wherein the light guide further includes one or more concave microlenses in alignment with the one or more microperforations along at least one vertical axis.

18. The visual display element of claim 4, wherein the light guide comprises:
a first surface facing the base layer; and
a second surface opposite the first surface; wherein
the one or more convex microlenses are formed on the second surface of the light guide.

19. The visual display element of claim 4, wherein the light guide comprises:
a first end of the one or more microperforations has a first diameter;
a second end of the one or more microperforations has a second diameter larger than the first diameter; and
the second diameter of the one or more microperforations is substantially equal to a diameter of the one or more convex microlenses.

20. The visual display element of claim 13, wherein the microperforation has a first end having a first diameter and a second end opposite the first end and having a second diameter larger than the first diameter, the concave microlens has a third diameter, and the second diameter of the microperforation is substantially equal to the third diameter of the concave microlens.

* * * * *